United States Patent
Zhang et al.

(10) Patent No.: US 11,880,522 B2
(45) Date of Patent: Jan. 23, 2024

(54) TOUCH DISPLAY PANEL AND TOUCH DISPLAY DEVICE

(71) Applicants: Chengdu BOE Optoelectronics Technology Co., Ltd., Sichuan (CN); BOE Technology Group Co., Ltd., Beijing (CN)

(72) Inventors: Zhenhua Zhang, Beijing (CN); Fan He, Beijing (CN); Yingsong Xu, Beijing (CN); Jingyi Feng, Beijing (CN); Qian Ma, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 146 days.

(21) Appl. No.: 17/547,996

(22) Filed: Dec. 10, 2021

(65) Prior Publication Data
US 2022/0236819 A1 Jul. 28, 2022

(30) Foreign Application Priority Data
Jan. 28, 2021 (CN) .......................... 202110117700.9

(51) Int. Cl.
*G06F 3/041* (2006.01)
*H10K 50/844* (2023.01)
*H10K 59/40* (2023.01)

(52) U.S. Cl.
CPC ........ *G06F 3/0412* (2013.01); *G06F 3/04164* (2019.05); *H10K 50/844* (2023.02); *H10K 59/40* (2023.02); *G06F 2203/04107* (2013.01)

(58) Field of Classification Search
None
See application file for complete search history.

(56) References Cited

U.S. PATENT DOCUMENTS

2019/0196619 A1* 6/2019 Baek .................. G06F 3/04164

* cited by examiner

*Primary Examiner* — Brian M Butcher
(74) *Attorney, Agent, or Firm* — IPro, PLLC

(57) ABSTRACT

The present disclosure provides a touch display panel, including a display region and a non-display region surrounding the display region. The non-display region includes a bonding region arranged at one side of the display region along a first direction. The touch display panel further includes a display signal line and a touch signal line. The bonding region includes a first pad and a second pad, the display signal line is coupled to a flexible printed circuit via the first pad, the touch signal line is coupled to the flexible printed circuit via the second pad, and the second pad is arranged at one side of the first pad along a second direction.

20 Claims, 4 Drawing Sheets

TOUCH DISPLAY PANEL AND TOUCH DISPLAY DEVICE

CROSS-REFERENCE TO RELATED APPLICATION

This application claims a priority of the Chinese patent application No. 202110117700.9 filed on Jan. 28, 2021, which is incorporated herein by reference in its entirety.

TECHNICAL FIELD

The present disclosure relates to the manufacture of a display product, in particular to a touch display panel and a touch display device.

BACKGROUND

Screen-to-body ratio has become one of the main selling points for high-end mobile phones, and a display panel is required to be provided with a bezel at an increasingly small size. For a full-screen, bezel-free display product (such as mobile phone), a screen covers an entire front surface of the display product, so as to achieve a screen-to-body ratio of approximately 100%. In this way, it is able to improve the appearance of the mobile phone and provide a sense of technology. In addition, it is able to provide the mobile phone with a larger screen, so as to significantly improve the visual experience.

SUMMARY

In one aspect, the present disclosure provides in some embodiments a touch display panel, including a display region and a non-display region surrounding the display region. The non-display region includes a bonding region arranged at one side of the display region along a first direction, and a first bezel region and a second bezel region arranged respectively at two opposite sides of the bonding region along a second direction perpendicular to the first direction. The touch display panel further includes a display signal line and a touch signal line. The bonding region includes a first pad and a second pad, the display signal line is coupled to a flexible printed circuit via the first pad, the touch signal line is coupled to the flexible printed circuit via the second pad, and the second pad is arranged at one side of the first pad along the second direction.

In a possible embodiment of the present disclosure, the touch signal line includes a sensing signal line and a driving signal line, and the sensing signal line includes a first secondary sensing signal line extending along the first bezel region to the bonding region and a second secondary sensing signal line extending along the second bezel region to the bonding region. The first secondary sensing signal line includes a first portion arranged at the bonding region and extending along the first direction to the second pad. The second secondary sensing signal line includes a second portion, a third portion and a fourth portion arranged at the bonding region, the second portion extends along the first direction, the third portion extends from one end of the second portion, is bent and then extends along the second direction, and the fourth portion extends from one end of the third portion, is bent and then extends along the first direction to the second pad. The driving signal line is extracted from a side of the display region adjacent to the bonding region, and extends along the first direction to the second pad.

In a possible embodiment of the present disclosure, the bonding region includes a bending region and a non-bending region along the first direction, and the third portion is arranged at a side of the bending region adjacent to or away from the display region.

In a possible embodiment of the present disclosure, the touch signal line includes a sensing signal line and a driving signal line, the sensing signal line extends along the first bezel region to the bonding region and includes a fifth portion arranged at the bonding region and extending along the first direction to the second pad, the driving signal line is extracted from a side of the display region adjacent to the bonding region and includes a first secondary driving signal line and a second secondary driving signal line, the first secondary driving signal line is arranged at a side adjacent to the second pad and extends along the first direction to the second pad, the second secondary driving signal line includes a sixth portion, a seventh portion and an eighth portion, the sixth portion extends along the first direction, the seventh portion extends from one end of the sixth portion, is bent and then extends along the second direction, and the eighth portion extends from one end of the seventh portion, is bent and then extends along the first direction to the second pad.

In a possible embodiment of the present disclosure, the bonding region includes a bending region and a non-bending region along the first direction, and the seventh portion is arranged at a side of the bending region adjacent to or away from the display region.

In a possible embodiment of the present disclosure, an isolation layer is arranged between the display signal line and the touch signal line in the bonding region in a direction away from a substrate.

In a possible embodiment of the present disclosure, the isolation layer includes an organic material layer made of an organic material.

In a possible embodiment of the present disclosure, the isolation layer includes a metal shielding line with a fixed potential, and the metal shielding line is arranged at a same layer as a power source signal line of the touch display panel.

In a possible embodiment of the present disclosure, the isolation layer includes a metal shielding line with a fixed potential and an organic material layer arranged between the metal shielding line and the touch signal line, and the metal shielding line is arranged at a same layer as a power source signal line of the touch display panel.

In a possible embodiment of the present disclosure, the power source signal line serves as the metal shielding line.

In a possible embodiment of the present disclosure, a first inorganic insulation layer is arranged between the isolation layer and the touch signal line.

In a possible embodiment of the present disclosure, the touch display panel further includes a substrate, and an organic light-emitting unit and a thin film encapsulation layer laminated one on another on the substrate. A barrier layer is arranged at the non-display region in such a manner as to surround the display region, the thin film encapsulation layer includes a first region and a second region surrounding the first region, a part of the second region is arranged at a side of the barrier layer away from the substrate, a planarization layer is arranged at a side of the second region away from the substrate, and the touch signal line is extracted from the display region and extends through the planarization layer to the bonding region in the non-display region.

In a possible embodiment of the present disclosure, the touch display panel further includes a second inorganic insulation layer arranged at a side of the planarization layer away from the substrate.

In a possible embodiment of the present disclosure, a surface of the planarization layer adjacent to the bonding region is an arc-like surface.

In a possible embodiment of the present disclosure, an isolation layer is arranged between the display signal line and the touch signal line in the bonding region in a direction away from the substrate, and the isolation layer is arranged at a same layer, and made of a same material, as the planarization layer.

In a possible embodiment of the present disclosure, the planarization layer and the isolation layer are each made of an organic material.

In another aspect, the present disclosure provides in some embodiments a touch display device including the above-mentioned touch display panel.

DETAILED DESCRIPTION

Figure 1:
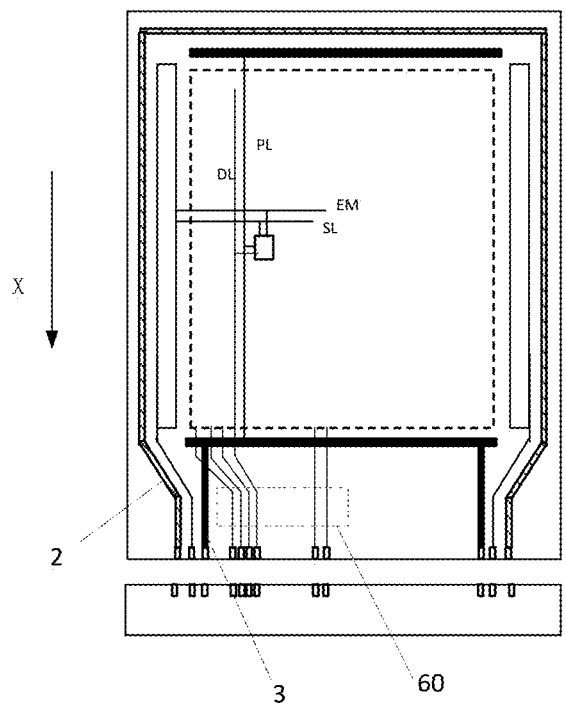
FIG. 1 is a schematic view showing the distribution of lines on a conventional touch display panel after the removal of a touch layer.

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

In the embodiments of the present disclosure, it should be appreciated that, such words as "in the middle of", "on/ above", "under/below", "left", "right", "vertical", "horizontal", "inside" and "outside" may be used to indicate directions or positions as viewed in the drawings, and they are merely used to facilitate the description in the present disclosure, rather than to indicate or imply that a device or member must be arranged or operated at a specific position. In addition, such words as "first", "second" and "third" may be merely used to differentiate different components rather than to indicate or imply any importance.

In the design of an on-cell touch panel, usually a touch active region is greater than an active display region of the panel, i.e., an edge of a touch electrode block extends beyond the active display region. In addition, a touch signal line needs to be extracted from an upper end of a display region and extends along each of a left side and a right side of the display region to a bonding region at a lower end, is coupled to a Flexible Printed Circuit (FPC), and then is coupled to a touch integrated circuit (T-IC) via a line on the FPC. However, display signal lines are arranged in the middle of the bonding region as well as in the middle of the FPC, so the touch signal line at one side may inevitably cross the display signal line. Taking crosstalk into consideration, usually the FPC includes more than two layers, so as to shield signal interference. Hence, the manufacture cost of the FPC, in terms of process steps and materials, may increase.

In addition, the touch signal line is provided with a larger width due to its large distance from the bonding region, so it is difficult to reduce a size of each of a left bezel and a right bezel of the on-cell touch display panel (its size has reached a limit). There is an urgent need to provide a new design to meet the requirement on a narrow bezel.

Figure 2:
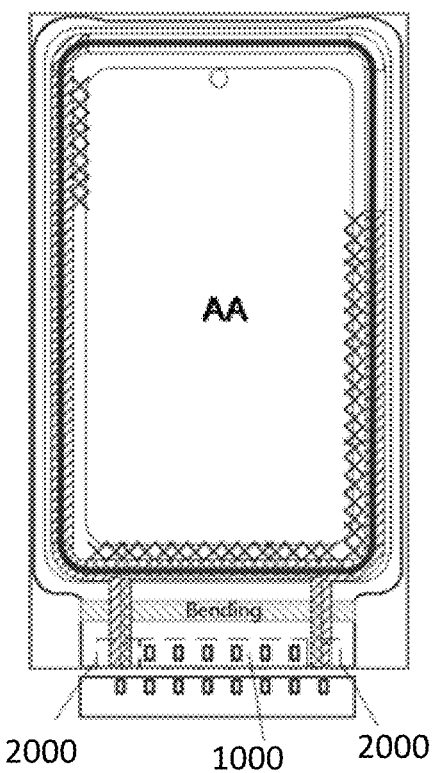
FIG. 2 is a schematic view showing the distribution of a touch signal line in the related art.

As shown in FIGS. 1 and 2, in the related art, a touch display panel includes a display region (AA) and a non-display region surrounding the display region. The non-display region includes a bonding region arranged at one side of the display region, and bezel regions arranged respectively at two opposite sides of the bonding region. A touch signal line is extracted from the display region, and extends along a corresponding bezel region to the bonding region. A first pad 1000 bound to a display signal line 60 and a second pad 2000 bound to the touch signal line are arranged at the bezel region. Each display signal line is coupled to the FPC via the first pad 1000, and each touch signal line is coupled to the FPC via a corresponding second pad 2000. Two second pads 2000 are arranged at two opposite sides of the first pad 1000 respectively. As shown in FIG. 2, the display signal line 60 is arranged along a first direction (i.e., direction X in FIG. 1), so a part of touch signal lines inevitably cross the display signal line 60. In the related art, in order to prevent the occurrence of interference between the display signal line 60 and the touch signal line, the FPC is of a multi-layered plate-like structure, and the quantity of layers is usually greater than two. After the touch signal line has been coupled to the FPC via the corresponding second pad 2000, it is coupled to a touch IC via a line on the FPC. Hence, the manufacture cost of the FPC, in terms of process steps and materials, may increase.

In order to solve the above-mentioned problems, the present disclosure provides in some embodiments a touch display panel, and a second pad 2000 bound to a touch signal line is arranged merely at a side of a first pad 1000 bound to a display signal line. In this way, it is able to reduce the quantity of lines on an FPC, and reduce the quantity of layers of the FPC, thereby to reduce the manufacture cost.

To be specific, the touch display panel includes a display region and a non-display region surrounding the display region. The non-display region includes a bonding region arranged at one side of the display region along a first direction, and a first bezel region and a second bezel region arranged respectively at two opposite sides of the bonding region along a second direction perpendicular to the first direction. The touch display panel further includes a display signal line and a touch signal line. The bonding region includes a first pad 1000 and a second pad 2000, the display signal line is coupled to a flexible printed circuit via the first pad 1000, the touch signal line is coupled to the flexible printed circuit via the second pad 2000, the second pad 2000 is arranged at one side of the first pad along the second direction.

In the embodiments of the present disclosure, there are the following wiring modes.

Figure 3:
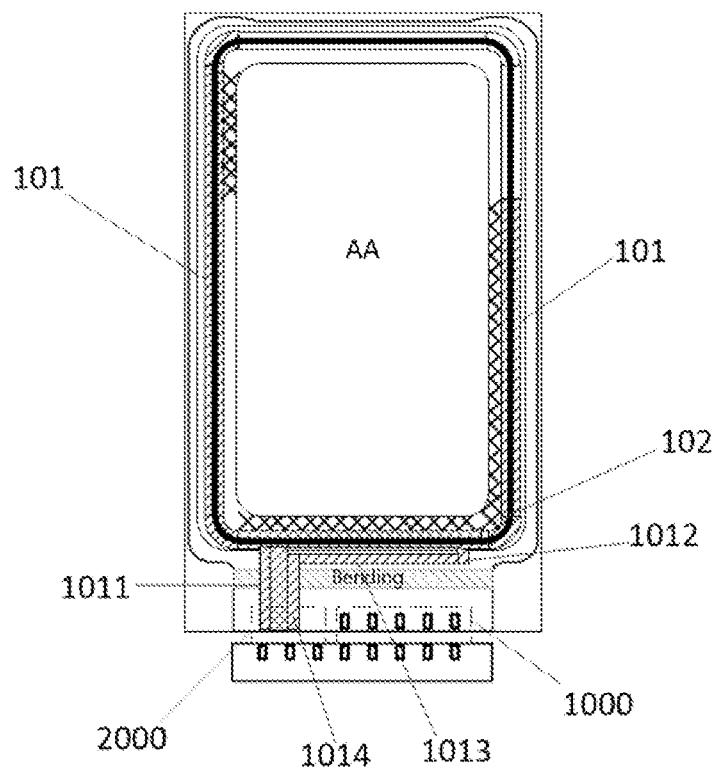
FIG. 3 is a schematic view showing the distribution of a touch signal line according to one embodiment of the present disclosure.
Figure 4:
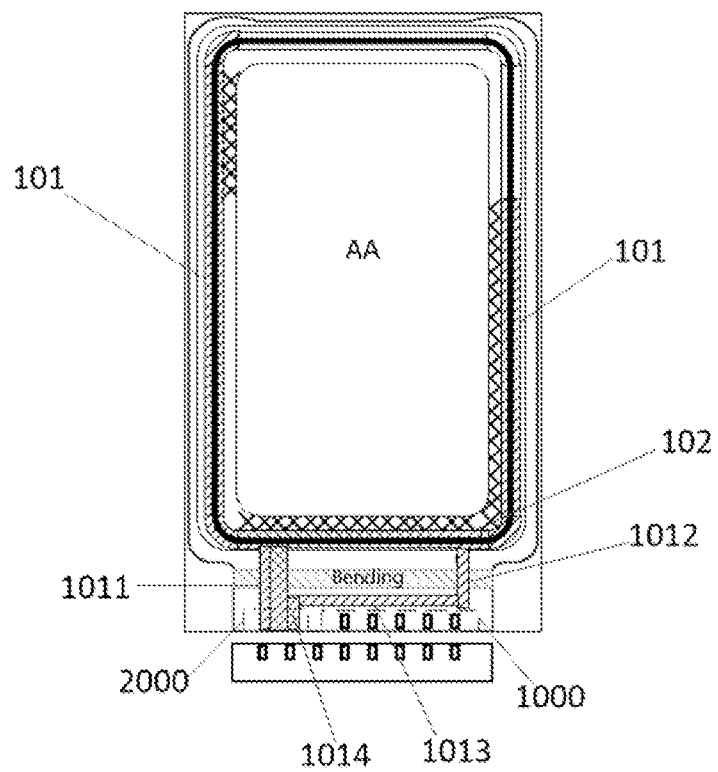
FIG. 4 is another schematic view showing the distribution of the touch signal line according to one embodiment of the present disclosure.

In a first mode, as shown in FIGS. 3 and 4, the touch signal line includes a sensing signal line 101 and a driving signal line 102, and the sensing signal line 101 includes a first secondary sensing signal line extending along the first bezel region to the bonding region and a second secondary sensing signal line extending along the second bezel region to the bonding region. The first secondary sensing signal line includes a first portion 1011 arranged at the bonding region and extending along the first direction to the second pad 2000. The second secondary sensing signal line includes a second portion 1012, a third portion 1013 and a fourth portion 1014 arranged at the bonding region, the second portion 1012 extends along the first direction, the third portion 1013 extends from one end of the second portion 1012, is bent and then extends along the second direction, and the fourth portion extends from one end of the third portion 1013, is bent and then extends along the first direction to the second pad 2000. The driving signal line 102 is extracted from a side of the display region adjacent to the bonding region, and extends along the first direction to the second pad 2000.

In this mode, the bonding region includes a bending region and a non-bending region along the first direction, and the third portion 1013 is arranged at a side of the bending region adjacent to or away from the display region. The first pad 1000 and the second pad 2000 are arranged at the non-bending region. FIG. 3 shows a situation where the third portion 1013 is arranged at the side of the bending region away from the display region, and FIG. 4 shows a situation where the third portion 1013 is arranged at the side of the bending region adjacent to the display region.

Figure 5:
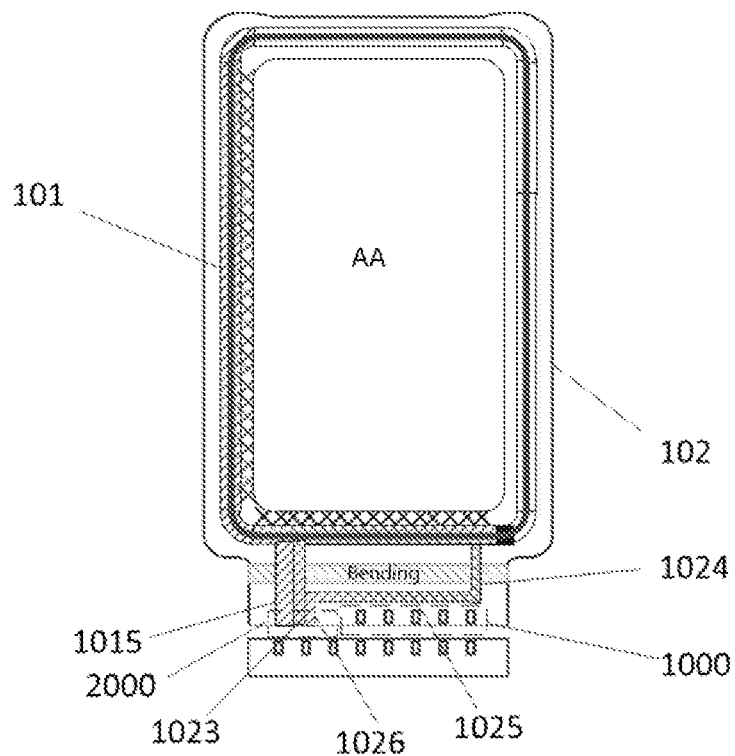
FIG. 5 is yet another schematic view showing the distribution of the touch signal line according to one embodiment of the present disclosure.
Figure 6:
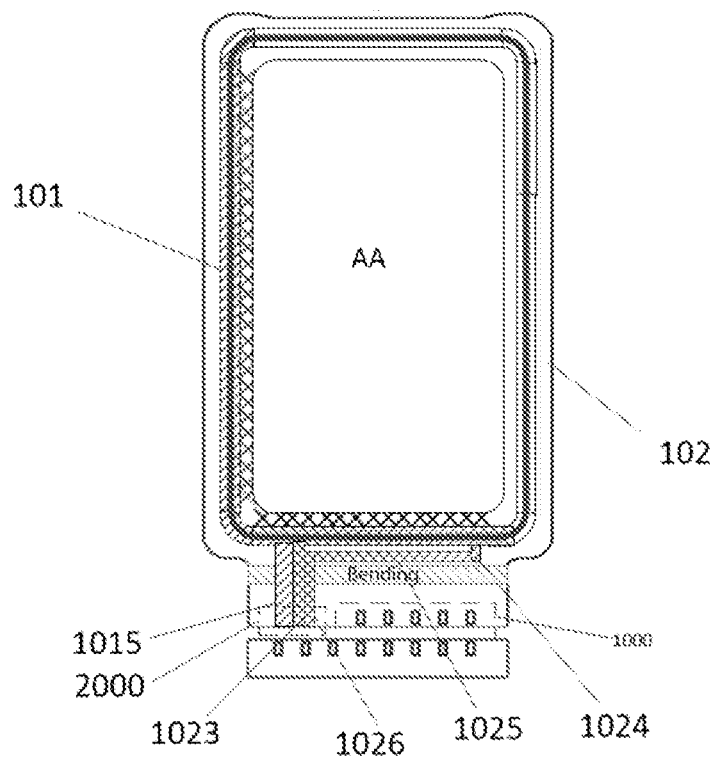
FIG. 6 is still yet another schematic view showing the distribution of the touch signal line according to one embodiment of the present disclosure.

In a second mode, as shown in FIGS. 5 and 6, illustratively, the touch signal line includes a sensing signal line 101 and a driving signal line 102, the sensing signal line 101 extends along the first bezel region to the bonding region and includes a fifth portion 1015 arranged at the bonding region and extending along the first direction to the second pad 200, and the driving signal line 102 is extracted from a side of the display region adjacent to the bonding region and includes a first secondary driving signal line 1023 and a second secondary driving signal line. The first secondary driving signal line 1023 is arranged at a side adjacent to the second pad 2000 and extends along the first direction to the second pad 2000. The second secondary driving signal line includes a sixth portion 1024, a seventh portion 1025 and an eighth portion 1026. The sixth portion 1024 extends along the first direction, the seventh portion 1025 extends from one end of the sixth portion 1024, is bent and then extends along the second direction, and the eighth portion 1026 extends from one end of the seventh portion 1025, is bent and then extends along the first direction to the second pad 2000.

In this mode, the bonding region includes a bending region and a non-bending region along the first direction, and the seventh portion 1025 is arranged at a side of the bending region adjacent to or away from the display region. The first pad 1000 and the second pad 2000 are arranged at the non-bending region. FIG. 5 shows a situation where the seventh portion 1025 is arranged at the side of the bending region away from the display region, and FIG. 6 shows a situation where the seventh portion 1025 is arranged at the side adjacent of the bending region to the display region.

Figure 10:
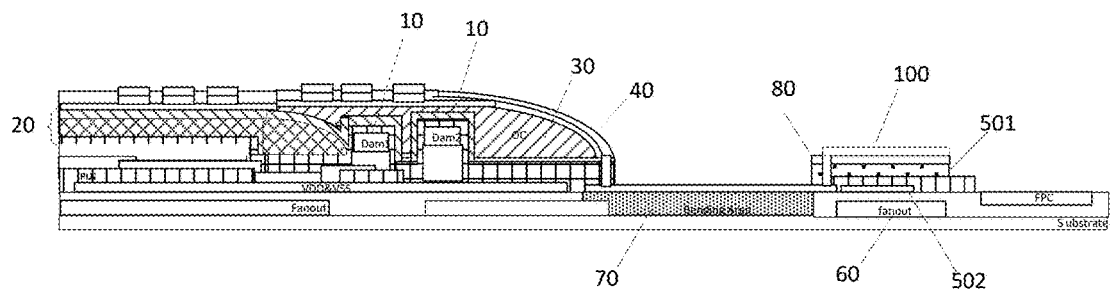
FIG. 10 is yet another partially schematic view of a touch display panel according to one embodiment of the present disclosure.

As shown in FIG. 10, illustratively, an isolation layer is arranged between the display signal line 60 and the touch signal line 100 in the bonding region in a direction away from a substrate.

Illustratively, the isolation layer includes an organic material layer 501 (also referred to as (overcoat layer, OC layer)) made of an organic material, such as a polymer, e.g., polyacrylate, polyimide or polycarbonate.

Through the organic material layer 501, it is able to increase a distance between the display signal line 60 and the touch signal line 100 in a direction perpendicular to a substrate, thereby to prevent the occurrence of the interference between the display signal line 60 and the touch signal line 100.

Illustratively, the isolation layer includes a metal shielding line 502 with a fixed potential, and the metal shielding line 502 is arranged at a same layer as a power source signal line of the touch display panel.

The metal shielding line 502 has a shielding effect, so it is able to prevent the occurrence of the interference between the display signal line 60 and the touch signal line 100.

Illustratively, the power source signal line serves as the metal shielding line 502.

As shown in FIGS. 3-6 and 10, in a direction away from the substrate, the touch display panel includes the display signal line 60, the power source signal line (signal line VDD 2 and signal line VSS 3 in FIG. 1) and the touch signal line 100. The metal shielding line 502 may be provided separately, or the power source signal line of the touch display panel may serve as the metal shielding line 502.

In some embodiments of the present disclosure, a width of a part of the power source signal lines in a direction parallel to the substrate increases, so that an orthogonal projection of the touch signal line 100 onto the substrate is located within the corresponding power source signal line. The power source signal line has a shielding effect, i.e., it serves as the metal shielding line. At this time, it is unnecessary to provide the metal shielding line separately, thereby to simplify the manufacture process.

In a specific embodiment of the present disclosure, the isolation layer includes the metal shielding line 502 and the organic material layer 501. The organic material layer 501 is arranged between the metal shielding line 502 and the touch signal line 100, so as to effectively prevent the occurrence of the interference between the display signal line 60 and the touch signal line 100.

Illustratively, a first inorganic insulation layer 80 is arranged between the isolation layer and the touch signal line 100, so as to protect the touch signal line 100 thereon.

Figure 7:
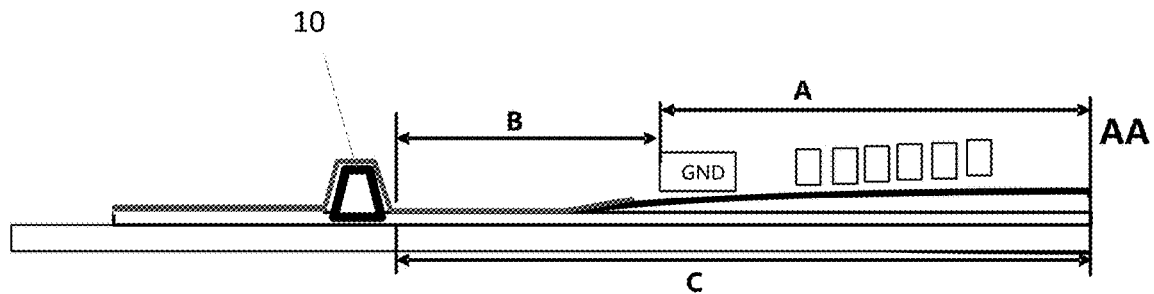
FIG. 7 is a partially schematic view of the conventional touch display panel.

As shown in FIG. 7, in the related art, the touch display panel includes to display region and a non-display region surrounding the display region. The non-display region includes a bonding region arranged at one side of the display region, and bezel regions respectively arranged at two opposite sides of the bonding region. A touch signal line is extracted from the display region, and extends along a corresponding bezel region to the bonding region. The non-display region further includes a barrier layer 10 surrounding the display region, and the touch signal line is arranged at a side of the barrier layer adjacent to the display region. Due to the touch signal line, the bezel needs to be provided with a sufficient large width. In the embodiments of the present disclosure, a planarization layer is arranged at a region of the non-display region where the barrier layer is located, and the touch signal line is arranged on the planarization layer. Hence, the barrier layer may be moved inwardly to be close to the display region, so as to reduce the width of the bezel region as a whole, thereby to provide a narrow bezel.

Figure 8:
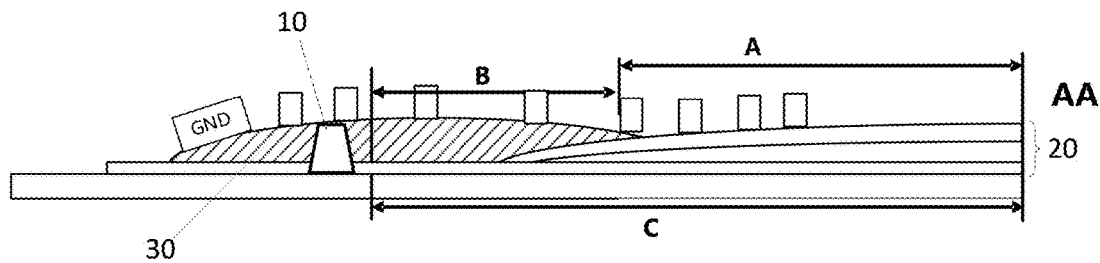
FIG. 8 is a partially schematic view of a touch display panel according to one embodiment of the present disclosure.
Figure 9:
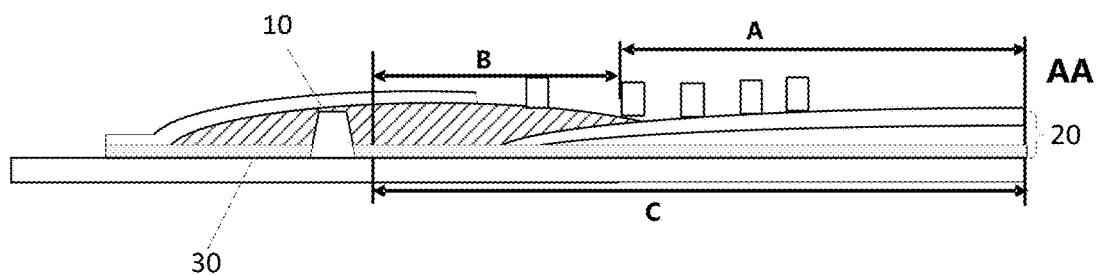
FIG. 9 is another partially schematic view of the touch display panel according to one embodiment of the present disclosure.

To be specific, as shown in FIGS. 8 to 10, the touch display panel includes a substrate, and an organic light-emitting unit and a thin film encapsulation layer 20 laminated one on another on the substrate. A barrier layer 10 is arranged at the non-display region in such a manner as to surround the display region, the thin film encapsulation layer 20 includes a first region and a second region surrounding the first region, a part of the second region is arranged at a side of the barrier layer 10 away from the substrate, a planarization layer 30 is arranged at a side of the second region away from the substrate, and the touch signal line is extracted from the display region and extends through the planarization layer 30 to the bonding region on the non-display region.

The thin film encapsulation layer 20 is arranged on the organic light-emitting unit, so as to prevent a light-emitting layer and other thin layers in the organic light-emitting unit from being adversely affected by external moisture and oxygen. The thin film encapsulation layer 20 includes at least one inorganic layer and at least one organic layer laminated one on another alternately. Usually, the barrier layer 10 includes a first barrier layer adjacent to the display region and a second barrier layer away from the display region. The first barrier layer functions as a stop region for the organic layer of the thin film encapsulation layer 20, so as to define a range of the organic layer. The second barrier layer functions as to prevent cracks generated in the inorganic layer of the thin film encapsulation layer 20 from spreading to an interior of the touch display panel, thereby to prevent an encapsulation effect of the thin film encapsulation layer 20 from being deteriorated.

The barrier layer 10 has a certain height, so when the touch signal line 100 is arranged on the barrier layer 10, it is easily broken, and thereby a touch defect occurs. Hence, the touch signal line 100 is arranged at a side of the barrier layer 10 adjacent to the display region, and a sufficient space needs to be reserved at the side of the barrier layer 10 adjacent to the display region for the touch signal line 100. At this time, it is impossible to further reduce a size of the bezel region. However, in the embodiments of the present disclosure, through the planarization layer 30, it is able to eliminate or reduce unevenness caused by the barrier layer 10 (i.e., eliminate or reduce a level difference between the first barrier layer and the second barrier layer and a level difference between the first barrier layer and the display region). The touch signal line 100 is arranged on the planarization layer 30, and extends over the barrier layer 10 to the bonding region smoothly without any fluctuations, so it is able to ensure the reliability of the touch signal line 100. Based on the above, as compared with FIGS. 7, 8 and 9, the non-display region of the touch display panel includes the bonding region and the bezel regions arranged respectively at two opposite sides of the bonding region. FIG. 8 shows the bezel region, and FIG. 9 shows the bonding region. In the embodiments of the present disclosure, the touch signal line 100 is arranged on the planarization layer 30, so widths of A and B may be reduced, i.e., a width C of the barrier layer 10 adjacent to the display region may be reduced. At this time, a part of the touch signal line 100 is arranged at a region corresponding to the barrier layer 10. As compared with a situation where the touch signal line 100 is arranged at the side of the barrier layer 10 adjacent to the display region as a whole, it is able to reduce the width of the bezel region, thereby to provide a narrow bezel.

In the embodiments of the present disclosure, the substrate is made of a rigid material, e.g., glass. When the substrate is a glass substrate, the touch display panel has a fixed shape. The substrate may be flexible, extendable, foldable, bendable or rollable, so as to provide a flexible, extendable, foldable, bendable or rollable touch display panel. The substrate may be made of any appropriate flexible insulation material, e.g., a polymer such as polyimide (PI), polycarbonate (PC), polyether sulfone (PES), polyethylene terephthalate (PET), polyethylene naphthalate (PEN), polyarylate (PAR) or fiber reinforced plastics (FRP). The substrate may be transparent, semi-transparent or non-transparent.

In the embodiments of the present disclosure, the planarization layer 30 is an OC layer made of an organic material, e.g., a polymer, such as polyacrylate, PI or PC, and it may be formed through, but not limited to, an adhesive coating or printing process.

Illustratively, the touch display panel further includes a second inorganic insulation layer arranged at a side of the planarization layer away from the substrate.

Through the second inorganic insulation layer 40, it is able to protect the touch signal line 100 thereon, thereby to prevent the occurrence of short-circuit or open-circuit.

Illustratively, a surface of the planarization adjacent to the bonding region is an arc-like surface. In this way, the touch signal line 100 extracted from the display region may extend to the bonding region along a smooth arc-like surface or an oblique surface, so it is able to ensure the stability of the touch signal line 100 to the greatest extend, thereby to ensure a reliable touch function.

In some embodiments of the present disclosure, in order to further reduce the interference between the display signal line 60 and the touch signal line 100, an isolation layer is arranged between the display signal line and the touch signal line in the bonding region in a direction away from the substrate. In some embodiments of the present disclosure, in order to simplify the manufacture process, the isolation layer is formed at the same time with the planarization layer, i.e., the isolation layer is arranged at a same layer, and made of a same material, as the planarization layer.

In some embodiments of the present disclosure, the planarization layer and the isolation layer are each made of an organic material, e.g., a polymer such as polyacrylate, PI or PC, and it may be formed through, but not limited to, an adhesive coating or printing process.

The present disclosure further provides in some embodiments a touch display device including the above-mentioned touch display panel. The touch display device may be a mobile phone, a desk-top computer, a laptop computer, a tablet computer or an electronic photo album. The touch display device includes the above-mentioned touch display panel, so it also has the advantages of the touch display panel as mentioned hereinabove.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A touch display panel, comprising a display region and a non-display region surrounding the display region, wherein the non-display region comprises a bonding region arranged at one side of the display region along a first direction, and a first bezel region and a second bezel region arranged respectively at two opposite sides of the bonding region along a second direction perpendicular to the first direction;

the touch display panel further comprises a display signal line and a touch signal line; and the bonding region comprises a first pad and a second pad, the display signal line is coupled to a flexible printed circuit via the first pad, the touch signal line is coupled to the flexible printed circuit via the second pad, and the second pad is arranged at one side of the first pad along the second direction;

wherein an isolation layer is arranged between the display signal line and the touch signal line in the bonding region in a direction away from a substrate;

wherein the isolation layer comprises a metal shielding line with a fixed potential, and the metal shielding line is arranged at a same layer as a power source signal line of the touch display panel.

2. The touch display panel according to claim 1, wherein the touch signal line comprises a sensing signal line and a driving signal line, and the sensing signal line comprises a first secondary sensing signal line extending along the first bezel region to the bonding region and a second secondary sensing signal line extending along the second bezel region to the bonding region;

the first secondary sensing signal line comprises a first portion arranged at the bonding region and extending along the first direction to the second pad;

the second secondary sensing signal line comprises a second portion, a third portion and a fourth portion arranged at the bonding region, the second portion extends along the first direction, the third portion extends from one end of the second portion, is bent and then extends along the second direction, and the fourth portion extends from one end of the third portion, is bent and then extends along the first direction to the second pad; and the driving signal line is extracted from a side of the display region adjacent to the bonding region, and extends along the first direction to the second pad.

3. The touch display panel according to claim 2, wherein the bonding region comprises a bending region and a non-bending region along the first direction, and the third portion is arranged at a side of the bending region adjacent to or away from the display region.

4. The touch display panel according to claim 1, wherein the touch signal line comprises a sensing signal line and a driving signal line, the sensing signal line extends along the first bezel region to the bonding region and comprises a fifth portion arranged at the bonding region and extending along the first direction to the second pad, the driving signal line is extracted from a side of the display region adjacent to the bonding region and comprises a first secondary driving signal line and a second secondary driving signal line, the first secondary driving signal line is arranged at a side adjacent to the second pad and extends along the first direction to the second pad, the second secondary driving signal line comprises a sixth portion, a seventh portion and an eighth portion, the sixth portion extends along the first direction, the seventh portion extends from one end of the sixth portion, is bent and then extends along the second direction, and the eighth portion extends from one end of the seventh portion, is bent and then extends along the first direction to the second pad.

5. The touch display panel according to claim 4, wherein the bonding region comprises a bending region and a non-bending region along the first direction, and the seventh portion is arranged at a side of the bending region adjacent to or away from the display region.

6. The touch display panel according to claim 1, wherein the isolation layer comprises an organic material layer made of an organic material.

7. The touch display panel according to claim 1, wherein the isolation layer further comprises an organic material layer arranged between the metal shielding line and the touch signal line.

8. The touch display panel according to claim 1, wherein the power source signal line serves as the metal shielding line.

9. The touch display panel according to claim 7, wherein the power source signal line serves as the metal shielding line.

10. The touch display panel according to claim 1, wherein a first inorganic insulation layer is arranged between the isolation layer and the touch signal line.

11. The touch display panel according to claim 1, further comprising a substrate, and an organic light-emitting unit and a thin film encapsulation layer laminated one on another on the substrate, wherein a barrier layer is arranged at the non-display region in such a manner as to surround the display region, the thin film encapsulation layer comprises a first region and a second region surrounding the first region, a part of the second region is arranged at a side of the barrier layer away from the substrate, a planarization layer is arranged at a side of the second region away from the substrate, and the touch signal line is extracted from the display region and extends through the planarization layer to the bonding region in the non-display region.

12. The touch display panel according to claim 11, further comprising a second inorganic insulation layer arranged at a side of the planarization layer away from the substrate.

13. The touch display panel according to claim 11, wherein a surface of the planarization layer adjacent to the bonding region is an arc-like surface.

14. A touch display panel, comprising a display region and a non-display region surrounding the display region, wherein the non-display region comprises a bonding region arranged at one side of the display region along a first direction, and a first bezel region and a second bezel region arranged respectively at two opposite sides of the bonding region along a second direction perpendicular to the first direction;

the touch display panel further comprises a display signal line and a touch signal line; and the bonding region comprises a first pad and a second pad, the display signal line is coupled to a flexible printed circuit via the first pad, the touch signal line is coupled to the flexible printed circuit via the second pad, and the second pad is arranged at one side of the first pad along the second direction;

wherein the touch display panel further comprises a substrate, and an organic light-emitting unit and a thin film encapsulation layer laminated one on another on the substrate, wherein a barrier layer is arranged at the non-display region in such a manner as to surround the display region, the thin film encapsulation layer comprises a first region and a second region surrounding the first region, a part of the second region is arranged at a side of the barrier layer away from the substrate, a planarization layer is arranged at a side of the second region away from the substrate, and the touch signal line is extracted from the display region and extends through the planarization layer to the bonding region in the non-display region;

wherein an isolation layer is arranged between the display signal line and the touch signal line in the bonding region in a direction away from the substrate, and the isolation layer is arranged at a same layer, and made of a same material, as the planarization layer.

15. The touch display panel according to claim 14, wherein the planarization layer and the isolation layer are each made of an organic material.

16. A touch display device, comprising a touch display panel, wherein the touch display panel comprises a display region and a non-display region surrounding the display region, wherein the non-display region comprises a bonding region arranged at one side of the display region along a first direction, and a first bezel region and a second bezel region arranged respectively at two opposite sides of the bonding region along a second direction perpendicular to the first direction;

the touch display panel further comprises a display signal line and a touch signal line; and the bonding region comprises a first pad and a second pad, the display signal line is coupled to a flexible printed circuit via the first pad, the touch signal line is coupled to the flexible printed circuit via the second pad, and the second pad is arranged at one side of the first pad along the second direction;

wherein an isolation layer is arranged between the display signal line and the touch signal line in the bonding region in a direction away from a substrate;

wherein the isolation layer comprises a metal shielding line with a fixed potential, and the metal shielding line is arranged at a same layer as a power source signal line of the touch display panel.

17. The touch display device according to claim 16, wherein the touch signal line comprises a sensing signal line and a driving signal line, and the sensing signal line comprises a first secondary sensing signal line extending along the first bezel region to the bonding region and a second secondary sensing signal line extending along the second bezel region to the bonding region;

the first secondary sensing signal line comprises a first portion arranged at the bonding region and extending along the first direction to the second pad;

the second secondary sensing signal line comprises a second portion, a third portion and a fourth portion arranged at the bonding region, the second portion extends along the first direction, the third portion extends from one end of the second portion, is bent and then extends along the second direction, and the fourth portion extends from one end of the third portion, is bent and then extends along the first direction to the second pad; and the driving signal line is extracted from a side of the display region adjacent to the bonding region, and extends along the first direction to the second pad.

18. The touch display device according to claim 17, wherein the bonding region comprises a bending region and a non-bending region along the first direction, and the third portion is arranged at a side of the bending region adjacent to or away from the display region.

19. The touch display device according to claim 16, wherein the touch display panel further comprises a substrate, and an organic light-emitting unit and a thin film encapsulation layer laminated one on another on the substrate, wherein a barrier layer is arranged at the non-display region in such a manner as to surround the display region, the thin film encapsulation layer comprises a first region and a second region surrounding the first region, a part of the second region is arranged at a side of the barrier layer away from the substrate, a planarization layer is arranged at a side of the second region away from the substrate, and the touch signal line is extracted from the display region and extends through the planarization layer to the bonding region in the non-display region.

20. The touch display device according to claim 19, wherein an isolation layer is arranged between the display signal line and the touch signal line in the bonding region in a direction away from the substrate, and the isolation layer is arranged at a same layer, and made of a same material, as the planarization layer.

* * * * *